Figure 1:
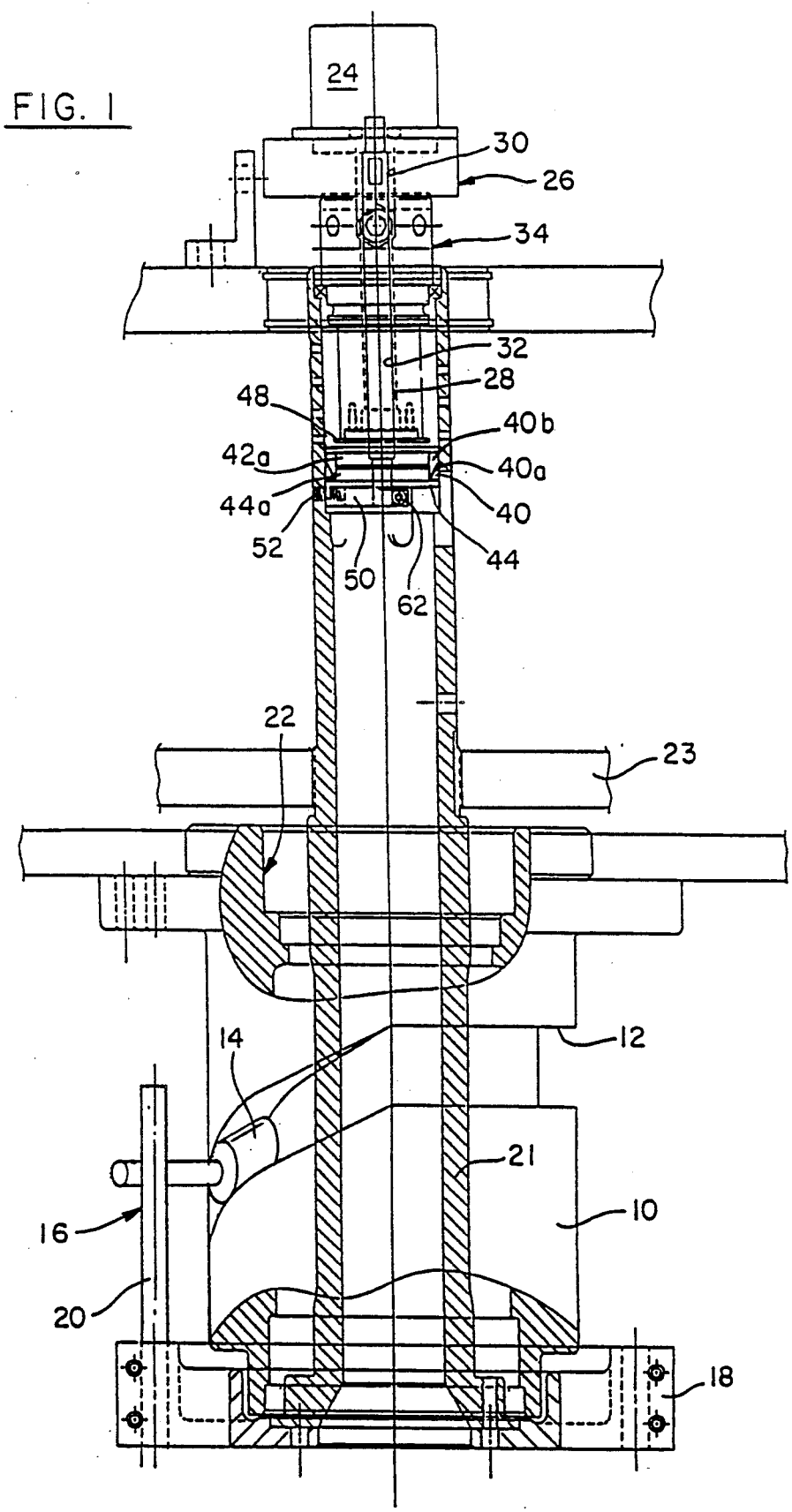

United States Patent [19]

Sooy

[11] Patent Number: 5,093,983
[45] Date of Patent: Mar. 10, 1992

[54] MACHINE FOR MOUNTING ELECTRONIC COMPONENTS

[75] Inventor: Robert Sooy, Marblehead, Mass.

[73] Assignee: Emhart Inc., Newark, Del.

[21] Appl. No.: 629,840

[22] Filed: Dec. 19, 1990

[51] Int. Cl.$^5$ ............................................. B23P 19/00
[52] U.S. Cl. ...................................... 29/740; 29/712; 403/369; 403/370
[58] Field of Search .......................... 29/740, 741, 712; 403/367, 369, 370

[56] References Cited

U.S. PATENT DOCUMENTS

| | | | |
|---|---|---|---|
| 2,308,542 | 1/1943 | Raybould | 403/370 |
| 2,508,039 | 5/1950 | Neuwirth | 403/369 |
| 2,999,706 | 9/1961 | Wilcox | 403/370 |
| 4,555,199 | 11/1985 | Maier et al. | 403/370 |

Primary Examiner—P. W. Echols
Attorney, Agent, or Firm—Spencer T. Smith

[57] ABSTRACT

A machine for mounting electronic components on a printed circuit board has a turret assembly which carries a plurality of tool assemblies. An encoder is directly connected to the turret shaft of the assembly by screwing the end of the encoder drive shaft into an expandable hub shaft locking device.

2 Claims, 2 Drawing Sheets

MACHINE FOR MOUNTING ELECTRONIC COMPONENTS

The present invention relates to machines for mounting surface mount electronic components and more particularly to such machines which have a turret carrying a plurality of tool assemblies.

Such a turret has to be rotatively driven to sequentially pass each tool assembly through the pick up, positioning, inspection and placement stations. The precise angular location of the turret is critical to desired high accuracy and an encoder is used to control the angular location of the turret. Conventionally the encoder is connected to the motor shaft which drives the drive belt connected to the turret assembly, but such a connection cannot compensate for the inherent play between that shaft and the turret.

It is accordingly an object of the present invention to provide an encoder system which will precisely track the position of the turret.

Other objects and advantages of the present invention will become apparent from the following portion of this specification and from the accompanying drawings which illustrate in accordance with the mandate of the patent statutes a presently preferred embodiment incorporating the principles of the invention.

Figure 2:
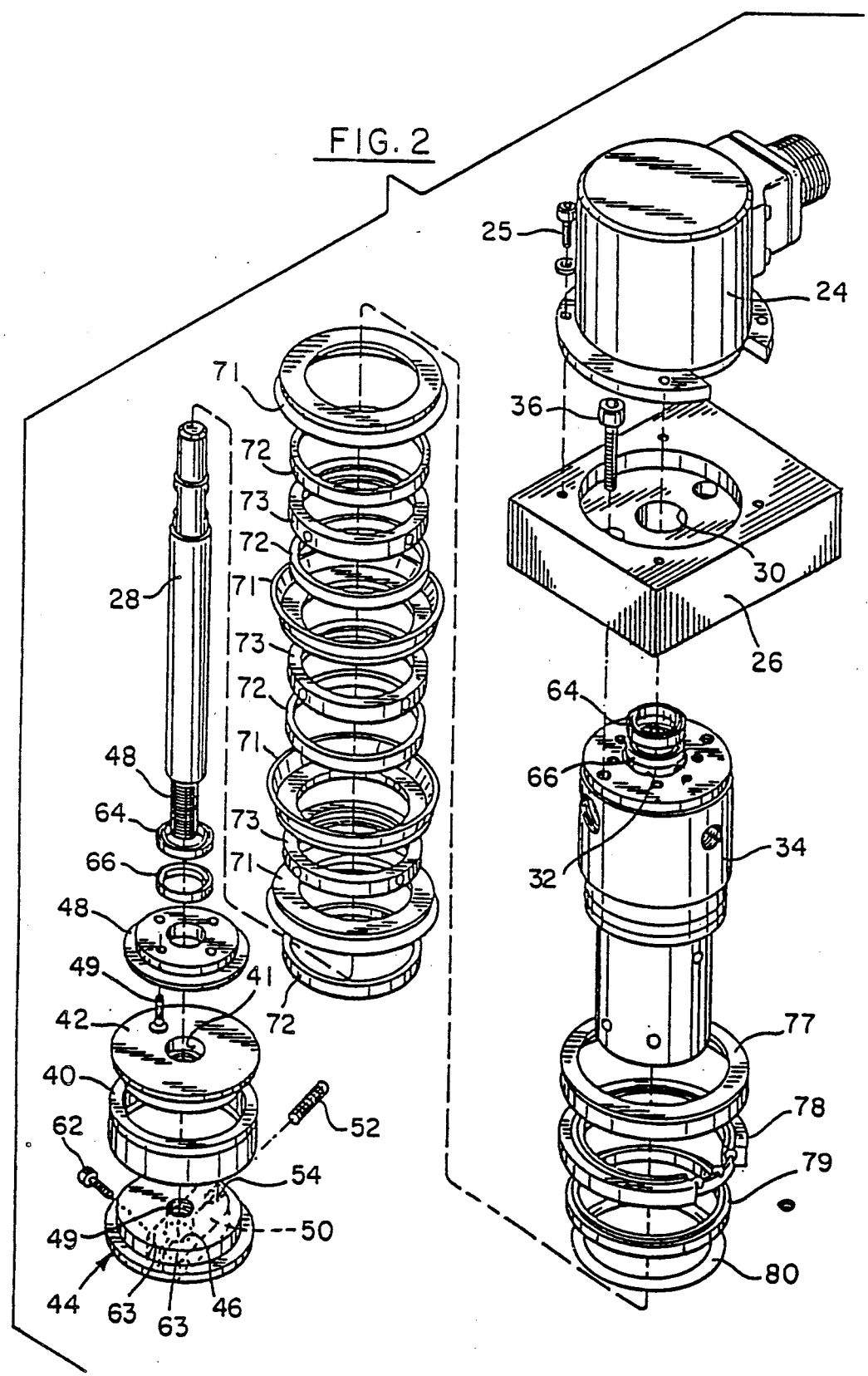

Referring to the drawings:

FIG. 1 is an elevational cross-sectional view of a portion of the turret assembly for a surface mount machine; and FIG. 2 is an oblique exploded view of the rotary manifold assembly shown in FIG. 1.

The turret assembly has a fixed cam 10 having a cam track 12 in which the follower 14 of a tool assembly 16 rides as the spider 18, which supports the vertically reciprocable rod 20 of the tool assembly, is rotated about the axis of the cam. The spider element 18 is secured at the bottom of the turret shaft 21 which is rotatably supported by suitable means (not shown) within the upper portion 22 of the cam. A driven pulley 23 is secured on the turret shaft to rotate the shaft.

An encoder 24 is mounted by screws 25 to a machine frame bracket 26 and a drive shaft 28, which is coupled to the encoder, passes downwardly through a hole 30 in this bracket and through a coaxial hole 32 in the manifold. The manifold is secured to the bracket by suitable screws 36.

A shaft-hub locking device is secured to the bottom of the drive shaft 28. This device has a locking device 40 having a pair of annular wedge elements 40a, 40b which are to be compressively sandwiched between a top member 42 and a bottom member 44. The threaded end of the drive shaft 28 will be threaded into the threaded bore of the bottom member until the shoulder 45 of the drive shaft 28 bottoms in the recessed hole 41 in the top member 42. The internal diameter of this hole 41 is selected to pilot the drive shaft 28 and the outer diameter of the top member is selected so that it will pilot the internal diameter of the turret shaft so that the drive shaft 28 will be centered. Further tightening of the drive shaft 28 into the bottom member will compress this assembly effectively clamping the locking device 40 to the turret shaft and the annular inset cylindrical portion 42a, and 44a of the top and bottom members. The threaded end of the drive shaft 28 also enters the threaded bore 49 of a yoke member 50.

To assemble the encoder assembly the shaft 28 with the hub-shaft locking device and yoke member 50 loosely secured thereto is lowered into the internal diameter of turret shaft 21 until the yoke slot 54 receives a pin 52 which is fastened to the turret shaft and the bottom surface of the end plate 44 comes to rest on the pin. The shaft 28 is then rotated until the internally tapered element 40a clampingly engages the turret shaft. A clamping screw 62 which extends through the split ends 63 of the yoke is then tightened to prevent the threaded end of the drive shaft 28 from unscrewing from the bottom end cap.

To assure that the drive shaft 28 rotates properly, a manifold end cap 48, which is secured to the manifold by screws 49, locates a lower bearing 64 and seal 66 and an upper manifold recess 32 locates an upper bearing 64 and seal 66.

A seal assembly made up of a number of cylinder seals 71, anti-crush rings 72 and spacers 73 and a bearing assembly made up of a V ring seal 77, a ball bearing 78, a shield 79 and a shield retaining D ring 80 are positioned to the manifold and the manifold is placed within the turret shaft 21 and secured to the bracket. The encoder is then coupled to the drive shaft 28.

I claim:

1. A machine for mounting components on a printed circuit board comprising
   a turret assembly including a fixed cam and a rotatable cylindrical turret shaft,
   an encoder, and
   means within said turret shaft for connecting said encoder with said turret shaft including
      an encoder drive shaft coupled to said encoder, said encoder drive shaft having a cylindrical portion and a reduced diameter threaded end portion and
   locking device means for clampingly interconnecting said turret shaft and said drive shaft, said locking device means including
      a pair of opposed annular wedging elements and
      a top member having a through bore recessed at the top thereof and a reduced diameter cylindrical portion for partial insertion into said wedging elements, and
      a bottom member having a reduced diameter cylindrical portion for partial insertion into said wedging elements elements and having a threaded bore for threadedly receiving said threaded portion of sad drive shaft so that tightening said drive shaft into said bottom member will clampingly interconnect said turret shaft and said drive shaft.

2. A machine for mounting components on a printed circuit board according to claim 1, further comprising means for preventing the unscrewing of said reduced diameter threaded end portion from said bottom member.